United States Patent [19]
Nishio

[11] Patent Number: 5,229,317
[45] Date of Patent: Jul. 20, 1993

[54] METHOD FOR PREVENTING OUT-DIFFUSION OF PHOSPHOROUS AND BORON IN A BPSG-BURIED TRENCH

[75] Inventor: Nobuya Nishio, Tokyo, Japan
[73] Assignee: NEC Corporation, Japan
[21] Appl. No.: 942,290
[22] Filed: Sep. 9, 1992

[30] Foreign Application Priority Data

Sep. 13, 1991 [JP] Japan .................. 3-234195

[51] Int. Cl.⁵ .............................................. H01L 21/76
[52] U.S. Cl. ............................... 437/67; 437/69; 437/72; 437/73; 148/DIG. 50; 148/DIG. 117
[58] Field of Search ................ 437/67, 69, 72, 73, 437/968; 148/DIG. 50, DIG. 117

[56] References Cited

U.S. PATENT DOCUMENTS

| | | | |
|---|---|---|---|
| 4,506,435 | 3/1985 | Pliskin et al. | 437/67 |
| 4,571,819 | 2/1986 | Rogers et al. | 448/DIG. 50 |
| 4,740,480 | 4/1988 | Ooka | 437/67 |

FOREIGN PATENT DOCUMENTS

| | | | |
|---|---|---|---|
| 0106133 | 6/1984 | Japan | 437/67 |
| 0020530 | 2/1985 | Japan | 437/67 |
| 0022663 | 1/1986 | Japan | 437/67 |
| 0258439 | 10/1989 | Japan | 437/67 |
| 0023631 | 1/1990 | Japan | 437/67 |
| 0203349 | 9/1991 | Japan | 437/67 |

Primary Examiner—Brian E. Hearn
Assistant Examiner—Trung Dang
Attorney, Agent, or Firm—Laff, Whitesel, Conte & Saret

[57] ABSTRACT

According to this invention, an isolation trench is formed in a semiconductor substrate. A first insulating film is formed on a surface of the semiconductor substrate and an inner surface of the trench. A silicon oxide film containing phosphorus and boron is buried in the trench in which the first insulating film is formed. A second insulating film pattern having a width larger than that of the trench is formed on the trench and a peripheral portion of the trench. The second insulating film pattern prevents out-diffusion phosphorus and boron in the silicon oxide film. The first insulating film which is not covered with the second insulating film pattern is removed to form a first insulating film pattern. The surface of the semiconductor substrate which is not covered with the first and second insulating film patterns is thermally oxidized.

5 Claims, 9 Drawing Sheets

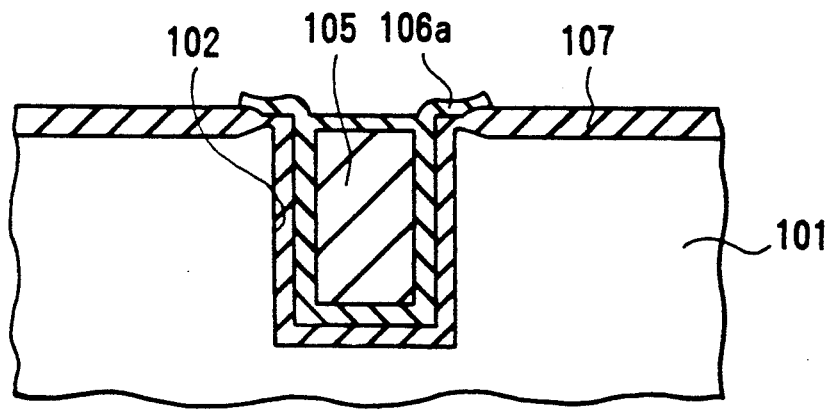
F I G. 4
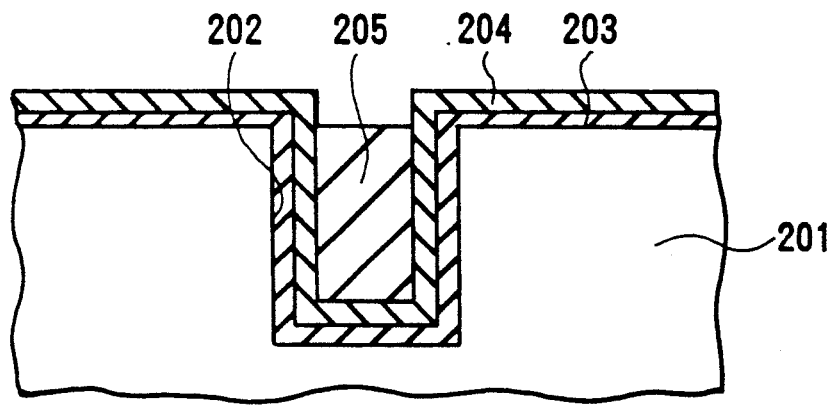
F I G. 5
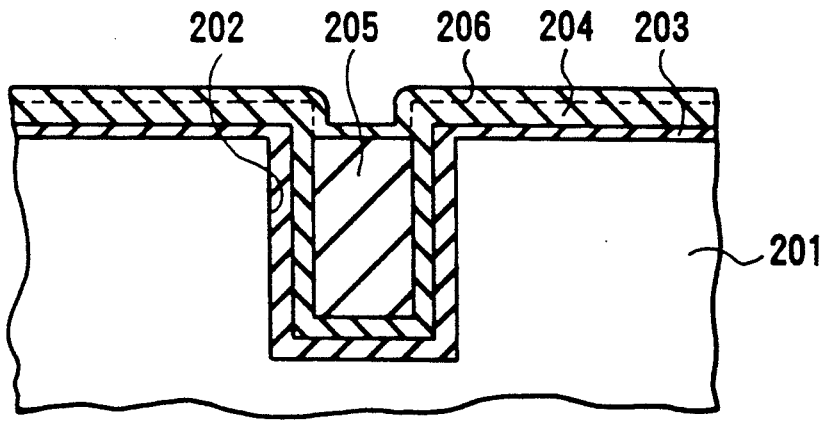
F I G. 6

METHOD FOR PREVENTING OUT-DIFFUSION OF PHOSPHOROUS AND BORON IN A BPSG-BURIED TRENCH

BACKGROUND OF THE INVENTION

The present invention relates to a method of manufacturing a semiconductor device and, more particularly, to a method of manufacturing a semiconductor substrate in which a silicon oxide film containing phosphorus and boron is buried in a trench used for isolating elements from each other formed on the same substrate.

In a semiconductor integrated circuit (to be referred to as an LSI hereinafter), a technique for electrically isolating elements from each other formed on the same substrate is necessary. A typical isolation technique is shown in FIGS. 10 and 12.

FIG. 10 shows a p-n isolating method using a p-n junction obtained by forming an n-type semiconductor element region 511a and a p-type semiconductor region 512 on a p-type semiconductor region 516 of a semiconductor substrate 501a.

FIG. 11 shows a LOCOS isolating method for a thick $SiO_2$ film 513 for isolating an n-type semiconductor region 511b on the p-type semiconductor region 516 of a semiconductor substrate 501b.

FIG. 12 shows a trench isolating method for forming a deep trench 512, reaching the p-type semiconductor region 516, for isolating an n-type semiconductor element region 511c on the p-type semiconductor region 516 of a semiconductor substrate 501c.

In recent years, in order to obtain the high integration density and high-speed operation of an LSI, the trench isolating method having the smallest area for isolation has been popularly used. In the trench isolation method, as shown in FIG. 12, an insulating film 514 is formed on the inner surface of a trench 512, and a polysilicon film 515 having a thermal expansion coefficient close to that of a silicon substrate is generally buried in the trench 512 in which the insulating film 514 is formed.

In reply to a demand of a further high-speed operation of an LSI, a method of decreasing a capacitance between elements by replacing a material buried in the trench 512 with an insulator having a low dielectric constant has been examined.

First, as an insulator to be buried in the trench 512, a silicon dioxide film having a low dielectric constant and good step coverage and formed by low-pressure CVD (Chemical Vapor Deposition) is considered. However, the shape of the film, like an $SiO_2$ film 8 shown in FIG. 13, is affected by the shape of a trench 2, thereby forming a depression 7 in the $SiO_2$ film 8 at the upper portion of the trench 2. Therefore, when the $SiO_2$ film 8 is etched by a depth corresponding to the thickness thereof to remove a part of the $SiO_2$ film 8 out of the trench 2, the $SiO_2$ film 8 left in the trench 2 is not suitable for the material to be buried in the trench 2 because the $SiO_2$ film 8 has a deep depression 7a in the trench 2 like an $SiO_2$ film 8a shown in FIG. 14.

For this reason, the concept of reflowing (remelting) is used. A silicon oxide film (borophosphosilicate glass; BPSG) is formed in the trench 2 by low-pressure CVD. This silicon oxide film contains boron and phosphorus, has a low dielectric constant, good step coverage, a reflow property better than that of an $SiO_2$ film doped with no impurity, and a small stress, and does not easily generate stress in the substrate. In this case, as will be described later, as shown in FIG. 16, a BPSG film 5 has a depression 7 at the upper portion of the trench 2 immediately after the BPSG film 5 is formed. However, when the BPSG film 5 is reflowed at a temperature of 900° C. to 1,000° C., the surface of the BPSG film 5 is smoothed as shown in FIG. 17. Therefore, when the BPSG film 5 is etched by a depth corresponding to the thickness thereof at the flat portion, a BPSG film 5b having a flat upper portion which is suitable for the material to be buried in the trench 2 is formed in the trench 2.

A conventional method of manufacturing a semiconductor device using a BPSG-buried trench will be described below with reference to the accompanying drawings.

FIGS. 15 to 21 are sectional views showing the main steps in manufacturing a semiconductor device by a conventional manufacturing method. As shown in FIG. 15, a trench 2 having a width of about 0.6 to 1.0 μm and a depth of 4 to 6 μm is formed in a semiconductor device 1, and an $SiO_2$ film 3 and an $Si_3N_4$ film 4 are sequentially formed on the surface of the semiconductor substrate 1 and the inner surface of the trench 2. The $Si_3N_4$ film 4 serves as a stopper for preventing phosphorus and boron in a BPSG film buried in the trench 2 (to be described later) from being diffused in the semiconductor substrate 1 when a barrier film and the BPSG film are etched. The thickness of the $Si_3N_4$ film 4 is about 50 to 150 nm (nanometer). Furthermore, the $SiO_2$ film 3 is used for preventing a stress generated when the $Si_3N_4$ film 4 is brought into direct contact with the semiconductor substrate 1 and has a thickness of about 30 to 200 nm. As shown in FIG. 16, a BPSG film 5 having a phosphorus concentration of 2 to 6 mol % and a boron concentration of 8 to 12 mol % is formed on the $Si_3N_4$ film 4 by low-pressure CVD to sufficiently bury the trench 2 and to have a thickness t1 which is ½ or more a width t2 of the trench 2 (t1≧t2/2). At this time, the BPSG film 5 has a depression 7 at the upper portion of the trench 2. The BPSG film 5 is reflowed by annealing at a temperature of 900° C. to 1,000° C. to smooth the surface of the BPSG film 5, thereby obtaining a BPSG film 5a shown in FIG. 17. The BPSG film 5a is etched using an etching liquid containing hydrofluoric acid by a depth corresponding to the thickness of the BPSG film 5a at a flat portion thereof to leave a BPSG film 5b in the trench 2 as shown in FIG. 18, so that the upper end of the BPSG film 5b has the same level as that of the surface of the semiconductor substrate 1. An unnecessary part of the $Si_3N_4$ film 4 on the surface of the semiconductor substrate 1 is etched using phosphoric acid heated at a temperature of 140° to 160° C. to expose the $SiO_2$ film on the surface of the semiconductor substrate 1, and an $Si_3N_4$ film 4a is left in the trench 2 as shown in FIG. 19. At this time, since the $SiO_2$ film 3 exposed on the semiconductor substrate 1 is exposed to the phosphoric acid used for etching the $Si_3N_4$ film 4, the $SiO_2$ film 3 has poor thickness controllability and poor film quality, and the $SiO_2$ film 3 cannot be used as a substrate protecting film for ion implantation or a gate oxide film of a MOS transistor. Therefore, the $SiO_2$ film 3 must be reformed. As shown in FIG. 20, the $SiO_2$ film 3a is left in the trench 2 and the $SiO_2$ film 3 on the surface of the semiconductor substrate 1 is partially etched by an etching liquid containing hydrofluoric acid. As shown in FIG. 21, the exposed surface of the semiconductor substrate 1 is thermally oxidized to form an $SiO_2$ film 30.

The SiO2 film 30 has a thickness required in the next step.

Subsequently, elements are formed on the semiconductor substrate 1 by a normal process. As described above, the BPSG film 5b having a dielectric constant lower than that of polysilicon is buried in the trench 2 for isolation, thereby manufacturing an LSI having a decreased capacitance between the elements.

In the conventional manufacturing method, since annealing at a temperature of 850° C. to 1,100° C. is performed while the surface of the semiconductor substrate and the BPSG film in the trench are exposed as shown in FIG. 14, phosphorus and boron in the BPSG film are diffused out as indicated by arrows in FIGS. 22 and 23, thereby forming an impurity diffusion region 9 in the semiconductor substrate 1 around the trench. Even when annealing (thermal oxidation) is performed at a temperature of 1,000° C. for 30 minutes, the impurity diffusion region 9 has a width of 0.5 $\mu$m or more on each side of the trench. Even when micropatterning is performed to obtain a trench having a width of 0.8 $\mu$m, when the SiO2 film formed on the inner wall of the trench extends to the semiconductor substrate 1 to have a width of 0.1 $\mu$m, and an impurity diffusion region formed by diffusion from the BPSG 5b has a width of 0.5 $\mu$m on each side of the trench. In this case, an isolation region has the width of 2.0 $\mu$m as shown in FIG. 9A, and the high integration density of an LSI cannot be easily obtained.

SUMMARY OF THE INVENTION

It is an object of the present invention to provide a method of manufacturing a semiconductor device for preventing formation of an unnecessary impurity diffusion region in a semiconductor substrate around an isolation trench.

It is another object of the present invention to provide a method of manufacturing a semiconductor device in which an area required for isolation is decreased to obtain a high integration density of a semiconductor integrated circuit.

It is still another object of the present invention to provide a method of manufacturing a semiconductor device capable of obtaining a high-speed operation of a semiconductor integrated circuit.

According to the present invention, there is provided a method of manufacturing a semiconductor device, comprising the steps of forming an isolation trench in a semiconductor substrate, forming a first insulating film on a surface of the semiconductor substrate and an inner surface of the trench, burying a silicon oxide film containing phosphorus and boron in the trench in which the first insulating film is formed, forming a second insulating film pattern having a width larger than that of the trench on the trench and a peripheral portion of the trench, the second insulating film pattern preventing out-diffusion of phosphorus and boron in the silicon oxide film, removing the first insulating film which is not covered with the second insulating film pattern to form a first insulating film pattern, and thermally oxidizing the surface of the semiconductor substrate which is not covered with the first and second insulating film patterns.

BRIEF DESCRIPTION OF THE DRAWINGS

FIGS. 1 to 4 are sectional views showing the main steps in manufacturing a semiconductor device according to the first embodiment of the present invention;

FIGS. 5 to 8 are sectional views showing the main steps in manufacturing a semiconductor device according to the second embodiment of the present invention;

DESCRIPTION OF THE PREFERRED EMBODIMENTS

Figure 1:
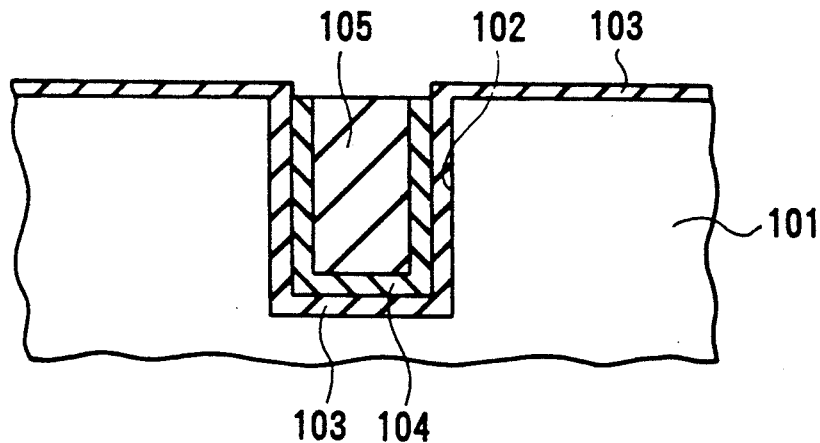
Figure 2:
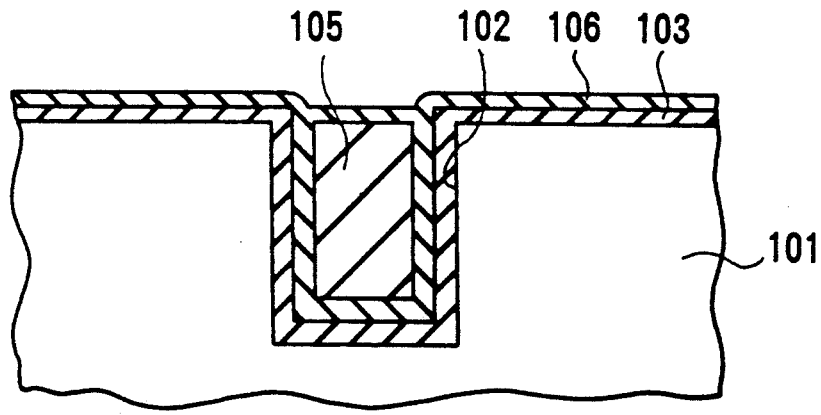
Figure 3:
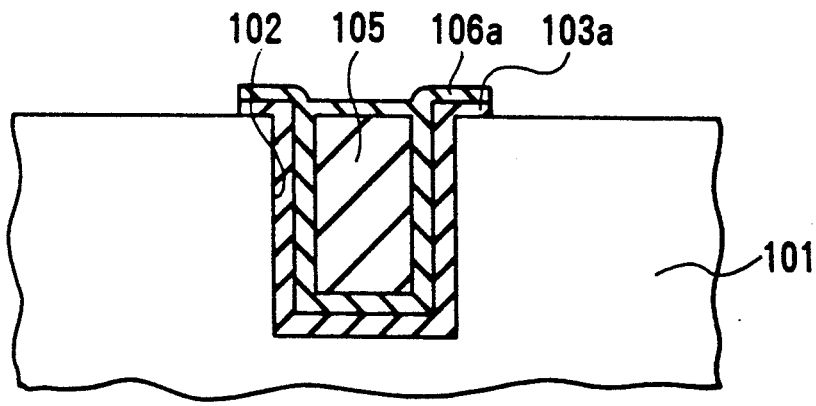
Figure 7:
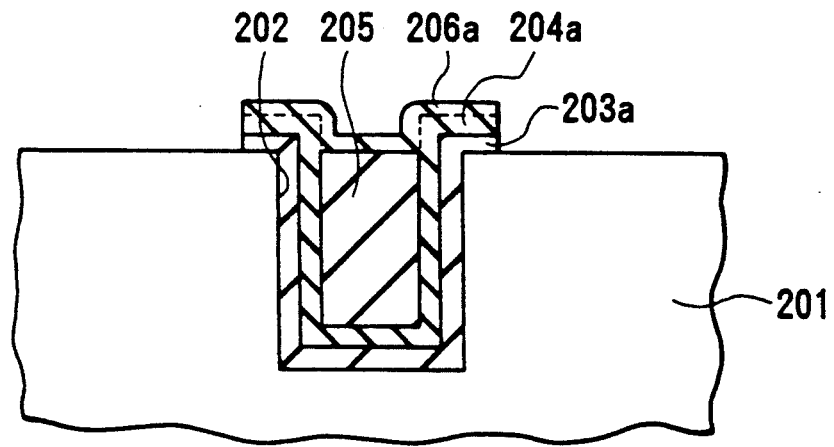
Figure 19:
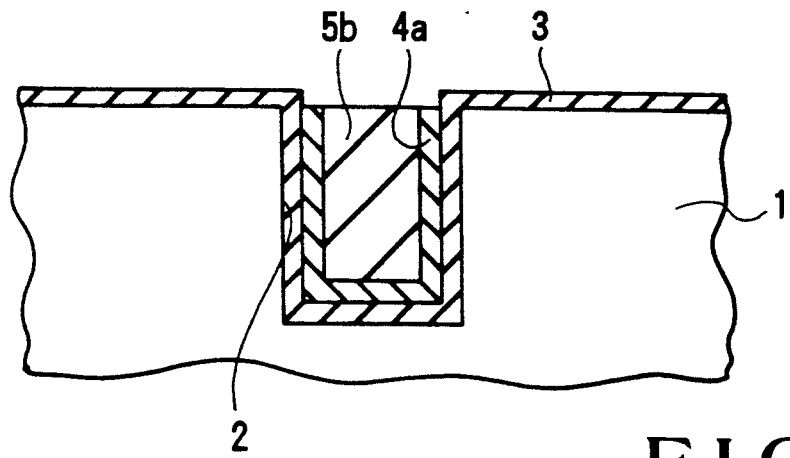
Figure 20:
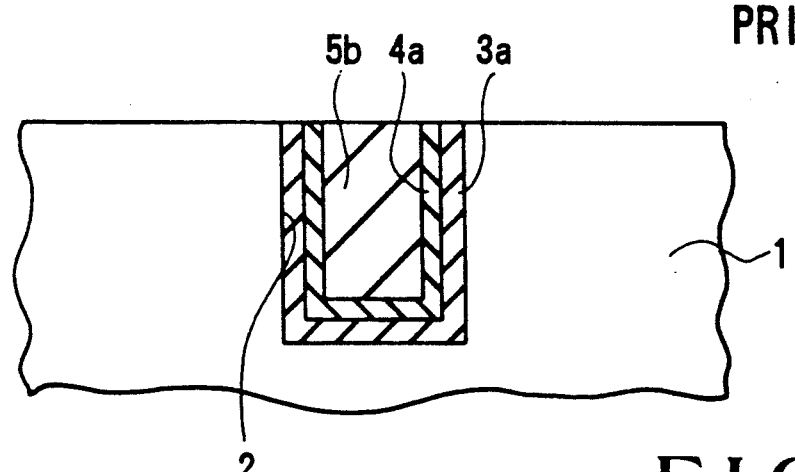
Figure 21:
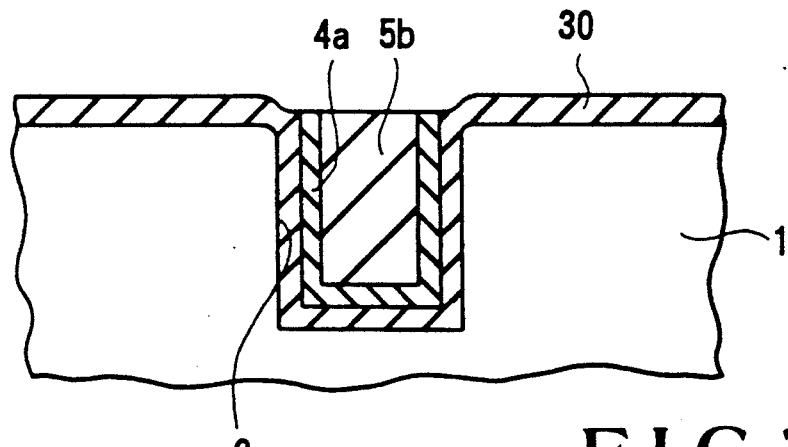
Figure 22:
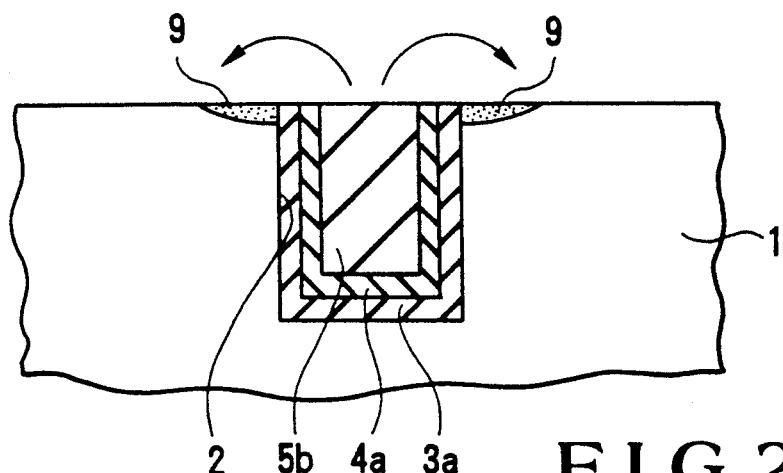
FIGS. 22 and 23 are views showing problems in the conventional method of manufacturing a semiconductor device.
Figure 23:
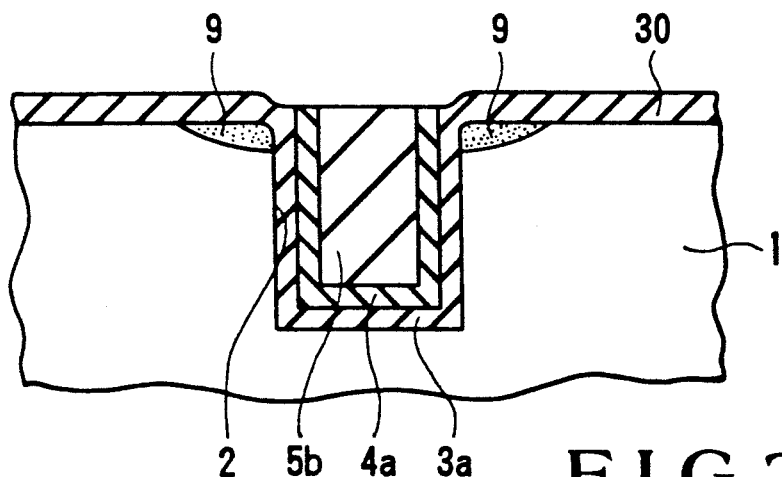

The present invention will be described below with reference to the accompanying drawings. FIGS. 1 to 4 show the main steps in manufacturing a semiconductor device according to the first embodiment of the present invention. The step in FIG. 1 corresponding to FIG. 19 is obtained according to the same method as that of the prior art. In FIG. 1, an SiO2 film 103 and an Si3N4 film 104 are sequentially formed on the surface of the semiconductor substrate 101 having a trench 102 and on the inner surface of the trench 102, and a BPSG film 105 is buried in the trench 102. As shown in FIG. 2, An Si3N4 film 106 having a thickness of 25 nm or more is formed by low-pressure CVD on the upper surface of the semiconductor substrate 101, i.e., the entire surface of the SiO2 film 103 and the BPSG film 105. The Si3N4 film 106 is used to prevent phosphorus and boron atoms in the BPSG film 105 from diffusion out when the surface of the semiconductor substrate is thermally oxidized to be described later. As shown in FIG. 3, the Si3N4 film 106 is partially etched by a normal photolithographic technique to leave an Si3N4 film 106a having a width larger than that of the trench 102 on the upper portion of the trench 102. In addition, the SiO2 film 103 is partially etched to leave an SiO2 film 103a having a width almost equal to that of the Si3N4 film 106a. The Si3N4 film 106 is etched using a photoresist as a mask by dry etching such as RIE (Reactive Ion Etching) to obtain high dimensional accuracy. The SiO2 film 103 is etched by wet etching using an etching liquid containing hydrofluoric acid to prevent the semiconductor substrate 101 from damage. In the first embodiment, in consideration of overetching and side etching of the Si3N4 film 104 and the SiO2 film 103 and positioning accuracy of an exposure device used in a lithographic technique, the width of the Si3N4 film 106a is larger than that of the trench 102 by 0.1 $\mu$m to 0.3 $\mu$m on each side. The exposed surface of the semiconductor substrate 101 is thermally oxidized to form an SiO2 film 107 as shown in FIG. 4. The SiO2 film 107 has a thickness required by the subsequent processes. Subsequently, elements are formed on the semiconductor substrate 101 by normal processes.

As described above, since the BPSG film 105 is covered with the Si3N4 film 106a when the semiconductor substrate is thermally oxidized, phosphorus or boron ion atoms in the BPSG film 105 are not diffused out, and an LSI can be manufactured without forming an impurity diffusion region around the trench.

Figure 8:
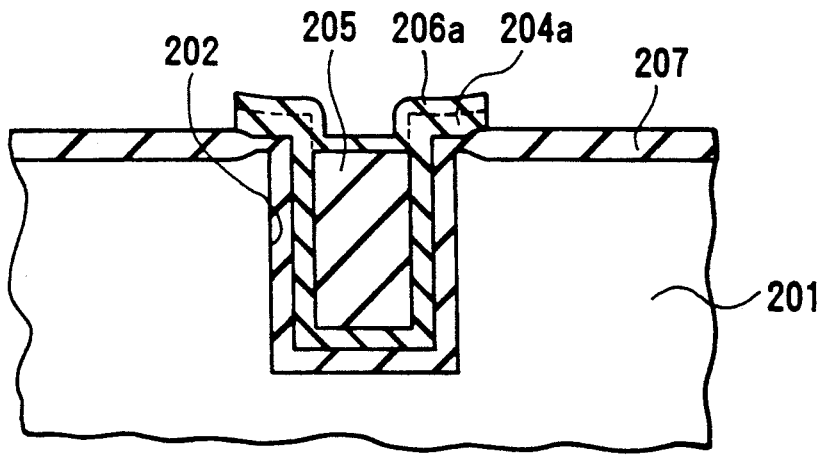
Figure 18:
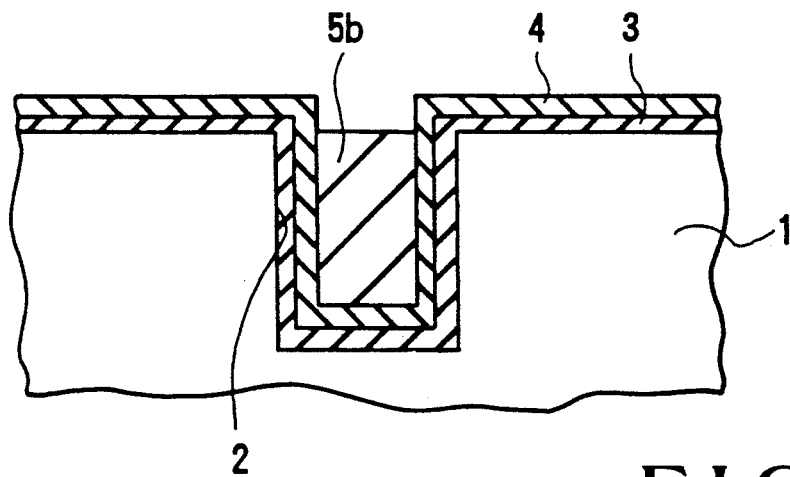

The second embodiment will be described below with reference to the accompanying drawings. FIGS. 5 to 8 show the main steps in manufacturing a semiconductor device according to the second embodiment of the present invention. The step in FIG. 5 corresponding to FIG. 18 is obtained according to the same method as that of the prior art. In FIG. 5, an SiO$_2$ film 203 and an Si$_3$N$_4$ film 204 are sequentially formed on a semiconductor substrate 201 and in a trench 202 formed in the semiconductor substrate 201, and a BPSG film 205 is buried in the trench 102. Unlike the first embodiment, as shown in FIG. 6, the Si$_3$N$_4$ film 204 is not removed, and an Si$_3$N$_4$ film 206 is formed on the Si$_3$N$_4$ film 204 and the BPSG film 205. The Si$_3$N$_4$ film 206 has a thickness of 25 nm or more as the Si$_3$N$_4$ film in the first embodiment (FIG. 3). The Si$_3$N$_4$ film 206 is etched by a normal photolithographic technique to leave the Si$_3$N$_4$ film 206 having a width larger than that of the trench 202, and the Si$_3$N$_4$ film 204 and the SiO$_2$ film 203 are etched to form Si$_3$N$_4$ films 206$a$ and 204$a$ and an SiO$_2$ film 203$a$. The exposed surface of the semiconductor substrate 201 is thermally oxidized to form an SiO$_2$ film 207 as shown in FIG. 8. The SiO$_2$ film 207 has a thickness required by the subsequent processes. Subsequently, elements are formed on the semiconductor substrate 201 by normal processes.

According to the second embodiment, unlike the first embodiment, the step of etching the Si$_3$N$_4$ film 204 in FIGS. 18 and 19 can be omitted, and the depression in the trench caused by overetching the Si$_3$N$_4$ film 204 can be prevented.

As described above, according to the manufacturing method of the present invention, in a semiconductor device in which a BPSG film having a low dielectric constant and contributing to the high-speed operation of an LSI is buried in a trench used for isolation, when the surface of a semiconductor substrate is to be thermally oxidized, the BPSG film in the trench is covered with the Si$_3$N$_4$ film, and diffusion of phosphorus and boron atoms from the BPSG film to form an impurity diffusion region around the trench can be prevented.

Figure 9A:
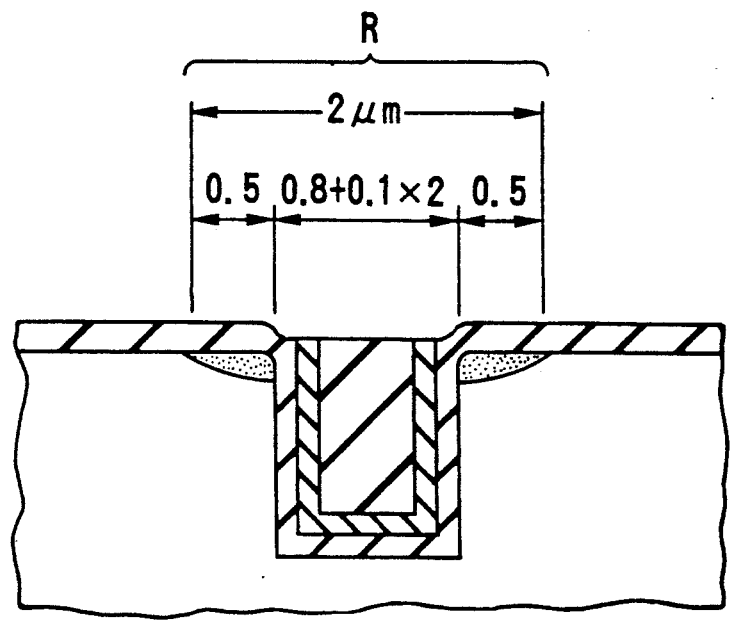
FIGS. 9A and 9B are views showing comparison between a conventional technique and the present invention.
Figure 9B:
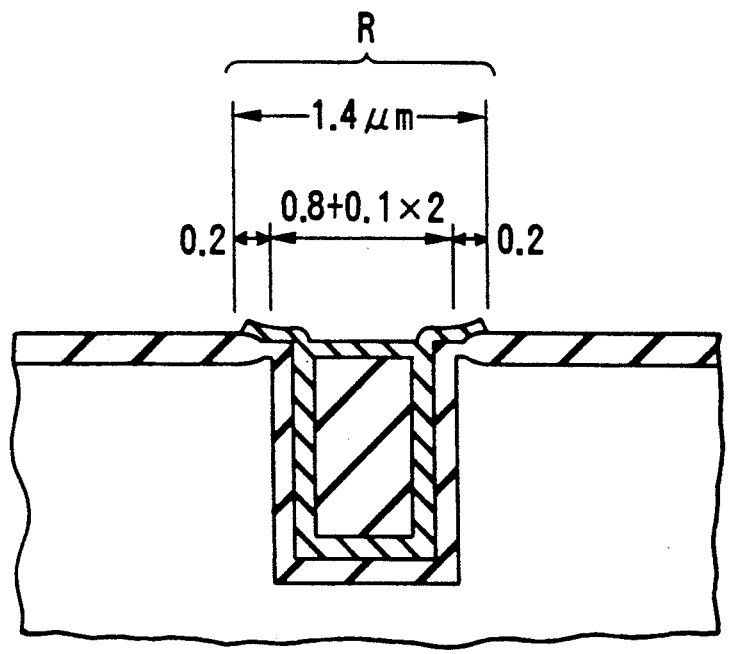
Figure 10:
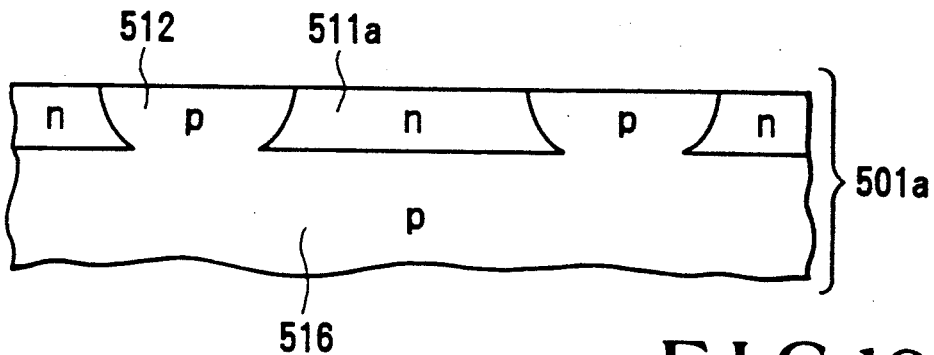
FIGS. 10 to 12 are views showing a typical isolation technique.
Figure 11:
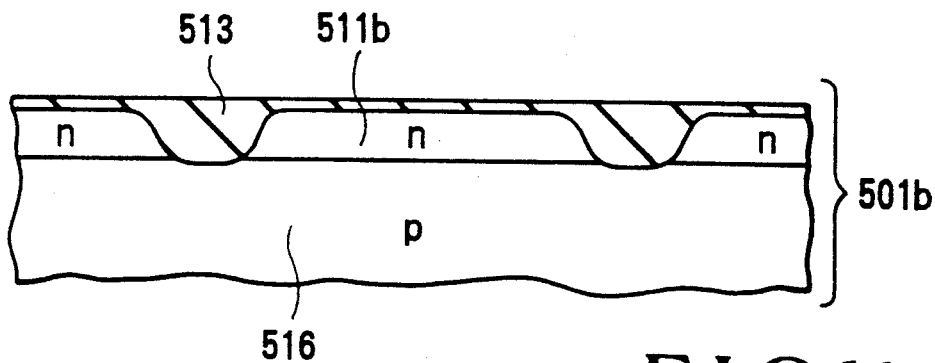
Figure 12:
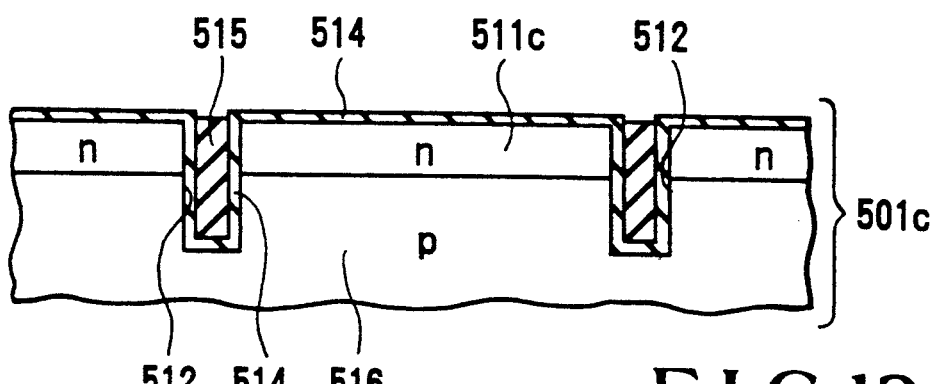
Figure 13:
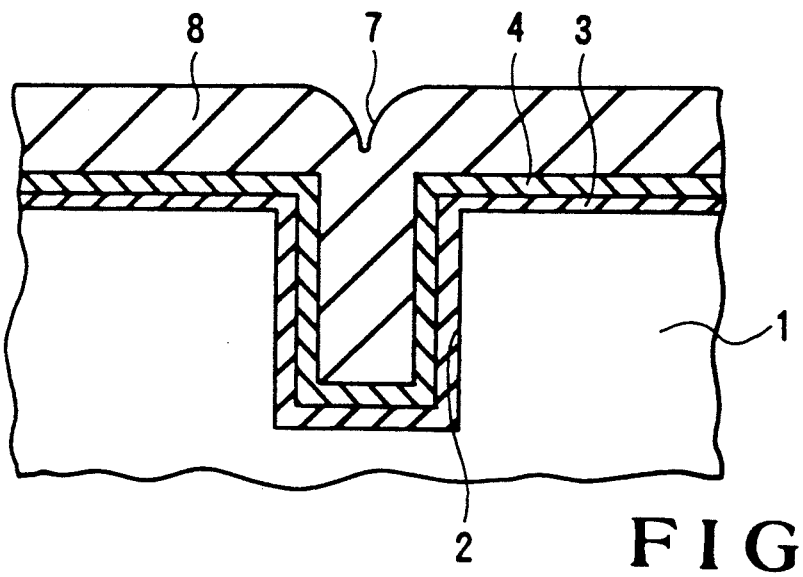
FIGS. 13 to 14 are sectional views showing a semiconductor device in which a silicon oxide film free from phosphorus is buried in a trench.
Figure 14:
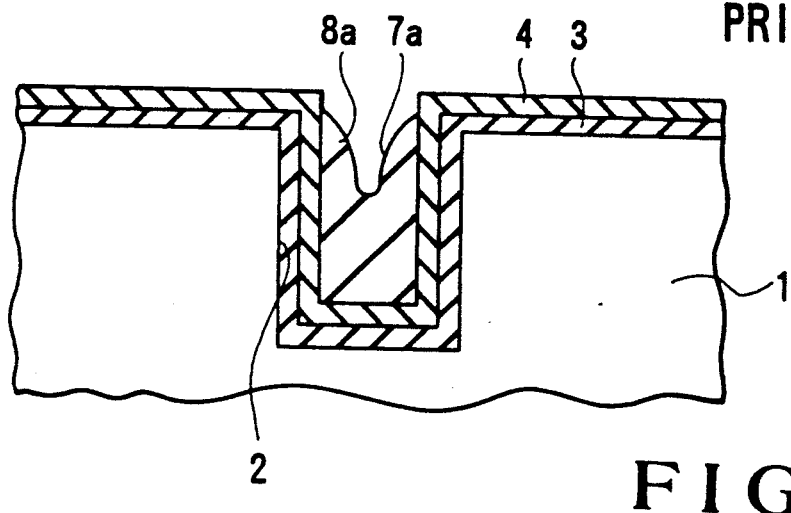
Figure 15:
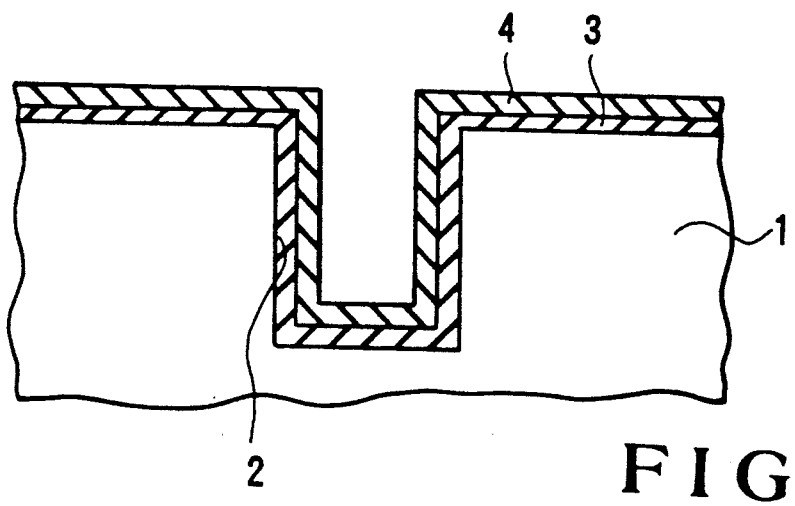
FIGS. 15 to 21 are sectional views showing the main steps in manufacturing a semiconductor device according to a conventional method of manufacturing a semiconductor device.
Figure 16:
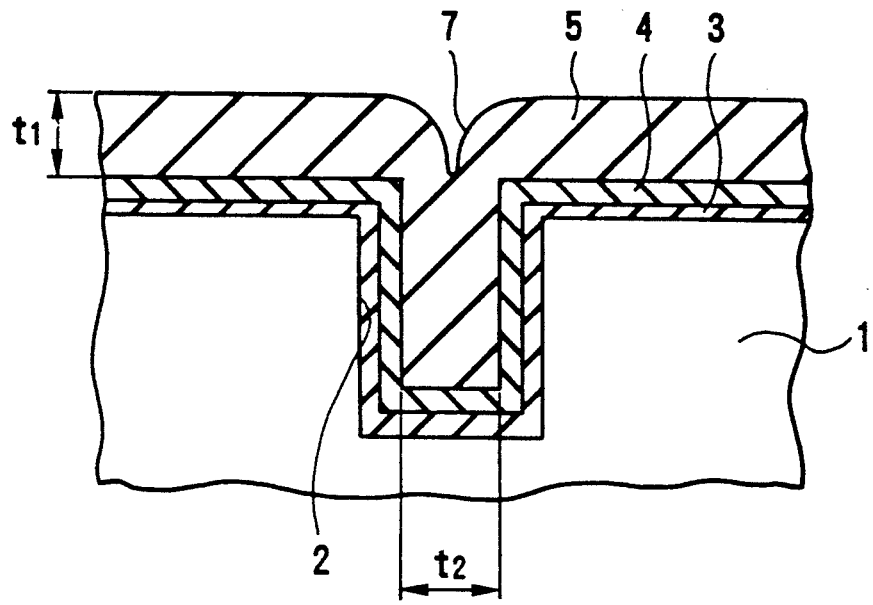
Figure 17:
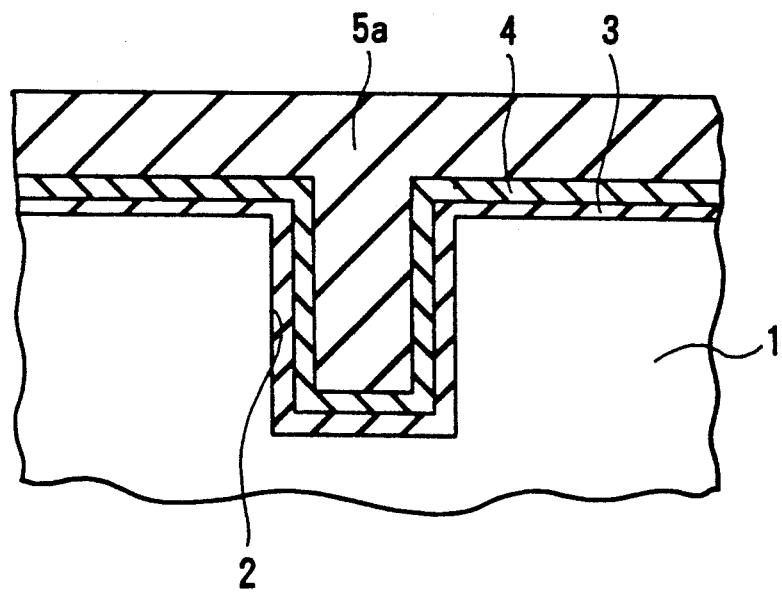

Therefore, assume that the trench used for isolation has a width of 0.8 μm, that an oxide film formed in the trench extends to the semiconductor substrate side to have a width of 0.1 μm on each side of the trench, and that the width of a diffusion region formed by diffusion from the BPSG film in a conventional method is set to be 0.5 μm on each side of the trench. In this case, as shown in FIG. 9A, an isolation region R requires a width of 2 μm in the conventional method. According to the present invention, however, as shown in FIG. 9B, when the width of the Si$_3$N$_4$ film covering the BPSG film is set to be larger than that of the trench by 0.2 μm on each side of the trench, the width of the isolation region R can be advantageously decreased by i.e., 1.4 μm.

What is claimed is:

1. A method of manufacturing a semiconductor device, comprising the steps of:
    forming an isolation trench in a semiconductor substrate;
    forming a first insulating film on a surface of said semiconductor substrate and an inner surface of said trench;
    burying a silicon oxide film containing phosphorus and boron in said trench in which said first insulating film is formed;
    forming a second insulating film pattern having a width larger than that of said trench on said trench and a peripheral portion of said trench, the second insulating film pattern preventing out-diffusion of phosphorus and boron in said silicon oxide film;
    removing said first insulating film which is not covered with said second insulating film pattern to form a first insulating film pattern; and
    thermally oxidizing the surface of said semiconductor substrate which is not covered with said first and second insulating film patterns.

2. A method according to claim 1, wherein said second insulating film pattern consists of silicon nitride.

3. A method according to claim 1 further comprising a step of forming a third insulating film consisting of the same material as that of the second insulating film pattern between said silicon oxide film and said first insulating film which are buried in said trench.

4. A method according to claim 3, wherein the step of forming said third insulating film comprises the steps forming a fourth insulating film on said first insulating film including said trench and removing said fourth insulating film from said semiconductor substrate after said silicon oxide film is buried in said trench in which said fourth insulating film is formed.

5. A method according to claim 3, wherein the steps of forming said third insulating film and said second insulating film pattern comprise the steps of forming said fourth insulating film on said first insulating film including said trench, forming a fifth insulating film on said fourth insulating film except for said trench and said silicon oxide film in said trench after said silicon oxide film is buried in said trench in which said fourth insulating film is formed, and etching said fourth and said fifth insulating films to leave said fourth and said fifth insulating films having a width larger than that of said trench.

* * * * *